US010535385B2

United States Patent
Tsuji et al.

(10) Patent No.: US 10,535,385 B2
(45) Date of Patent: Jan. 14, 2020

(54) SEMICONDUCTOR INTEGRATED CIRCUIT AND SEMICONDUCTOR DEVICE

(71) Applicant: TOSHIBA MEMORY CORPORATION, Minato-ku, Tokyo (JP)

(72) Inventors: Nobuhiro Tsuji, Yokohama Kanagawa (JP); Hiroki Ohkouchi, Yokohama Kanagawa (JP); Shota Note, Yokohama Kanagawa (JP); Masashi Nakata, Yokohama Kanagawa (JP); Yohei Yasuda, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/523,373

(22) Filed: Jul. 26, 2019

(65) Prior Publication Data
US 2019/0348093 A1 Nov. 14, 2019

Related U.S. Application Data

(63) Continuation of application No. 15/910,565, filed on Mar. 2, 2018, now Pat. No. 10,403,341.

(30) Foreign Application Priority Data

Sep. 13, 2017 (JP) .................................. 2017-176133

(51) Int. Cl.
*G11C 7/00* (2006.01)
*G11C 7/22* (2006.01)
(Continued)

(52) U.S. Cl.
CPC .......... *G11C 7/222* (2013.01); *G06F 13/1689* (2013.01); *H03K 5/1565* (2013.01); *H03L 7/08* (2013.01); *H03L 7/0814* (2013.01)

(58) Field of Classification Search
CPC .... G11C 29/023; G11C 11/4076; G11C 7/222
See application file for complete search history.

(56) References Cited

U.S. PATENT DOCUMENTS 6,198,690 B1 * 3/2001 Kato ........................ G06F 1/10
327/154
6,247,138 B1 6/2001 Tamura
(Continued)

OTHER PUBLICATIONS

Intel Corporation et al., "Open NAND Flash Interface Specification," published Apr. 2014, 315 pages.
(Continued)

*Primary Examiner* — Tuan T Nguyen
(74) *Attorney, Agent, or Firm* — Foley & Lardner LLP

(57) ABSTRACT

A semiconductor integrated circuit includes a register, a detection circuit, and a generation circuit. The register stores a detection start timing of a reference delay amount based on a first clock during a first period. The first period is a period in which the first clock starts to be input. The detection circuit has a plurality of delay stages. The detection circuit detects the reference delay amount at the start timing during the first period and obtains the number of delay stages corresponding to the reference delay amount. The generation circuit adjusts a duty ratio of the first clock based on the number of delay stages obtained by the detection circuit and generates a second clock during a second period. The second period is a period continuing from the first period.

12 Claims, 5 Drawing Sheets

(51) Int. Cl.
*H03K 5/156* (2006.01)
*G06F 13/16* (2006.01)
*H03L 7/08* (2006.01)
*H03L 7/081* (2006.01)

(56) References Cited

U.S. PATENT DOCUMENTS

| | | | |
|---|---|---|---|
| 6,292,412 B1* | 9/2001 | Kato | G11C 7/22 |
| | | | 365/194 |
| 6,313,676 B1* | 11/2001 | Abe | G11C 7/1072 |
| | | | 327/158 |
| 6,393,080 B1* | 5/2002 | Kamoshida | G11C 7/22 |
| | | | 365/194 |
| 6,449,727 B1 | 9/2002 | Toda | |
| 7,184,509 B2 | 2/2007 | Cho et al. | |
| 8,482,326 B2 | 7/2013 | Miyano | |
| 9,471,484 B2 | 10/2016 | Oh et al. | |
| 2001/0045579 A1 | 11/2001 | Ooishi | |
| 2002/0008558 A1 | 1/2002 | Okuda | |
| 2011/0248756 A1 | 10/2011 | Abe | |
| 2016/0071563 A1* | 3/2016 | Lee | G06F 13/1689 |
| | | | 365/189.07 |
| 2016/0147452 A1* | 5/2016 | Bae | G11C 29/023 |
| | | | 711/103 |
| 2019/0237127 A1* | 8/2019 | Moon | G06F 3/0604 |

OTHER PUBLICATIONS

Kim et al., "1 GB/s 2Tb NAND Flash Multi-Chip Package with Frequency-Boosting Interface Chip," 2015, 29 pages.

\* cited by examiner

SEMICONDUCTOR INTEGRATED CIRCUIT AND SEMICONDUCTOR DEVICE

CROSS-REFERENCE TO RELATED APPLICATION

This application is a continuation of U.S. patent application Ser. No. 15/910,565, filed Mar. 2, 2018, which claims the benefit of and priority to Japanese Patent Application No. 2017-176133, filed Sep. 13, 2017, the entire contents of which are incorporated herein by reference.

FIELD

Embodiments described herein relate generally to a semiconductor integrated circuit and a semiconductor device.

BACKGROUND

A semiconductor integrated circuit used for interfaces of a semiconductor memory receives a reference clock and data from the outside, adjust duty ratio of the reference clock to generate an internal clock, and supply the generated internal clock to the semiconductor memory. The semiconductor memory can latch the received data with the internal clock. It is desired to improve generation of the internal clocks.

DETAILED DESCRIPTION

Exemplary embodiments provide a semiconductor integrated circuit and a semiconductor device capable of appropriately generating an internal clock.

In general, according to some embodiments, there is provided a semiconductor integrated circuit including a register, a detection circuit, and a generation circuit. The register stores a detection start timing of a reference delay amount based on a first clock during a first period. The first period is a period in which the first clock starts to be input. The detection circuit has a plurality of delay stages. The detection circuit detects the reference delay amount at the start timing during the first period and obtains the number of delay stages corresponding to the reference delay amount. The generation circuit adjusts a duty ratio of the first clock based on the number of delay stages obtained by the detection circuit and generates a second clock during a second period. The second period is a period continuing from the first period.

Hereinafter, a semiconductor integrated circuit according to some embodiments will be described in detail with reference to the appended drawings. Exemplary embodiments of the present disclosure are not limited to the embodiments.

Embodiment

Figure 1:
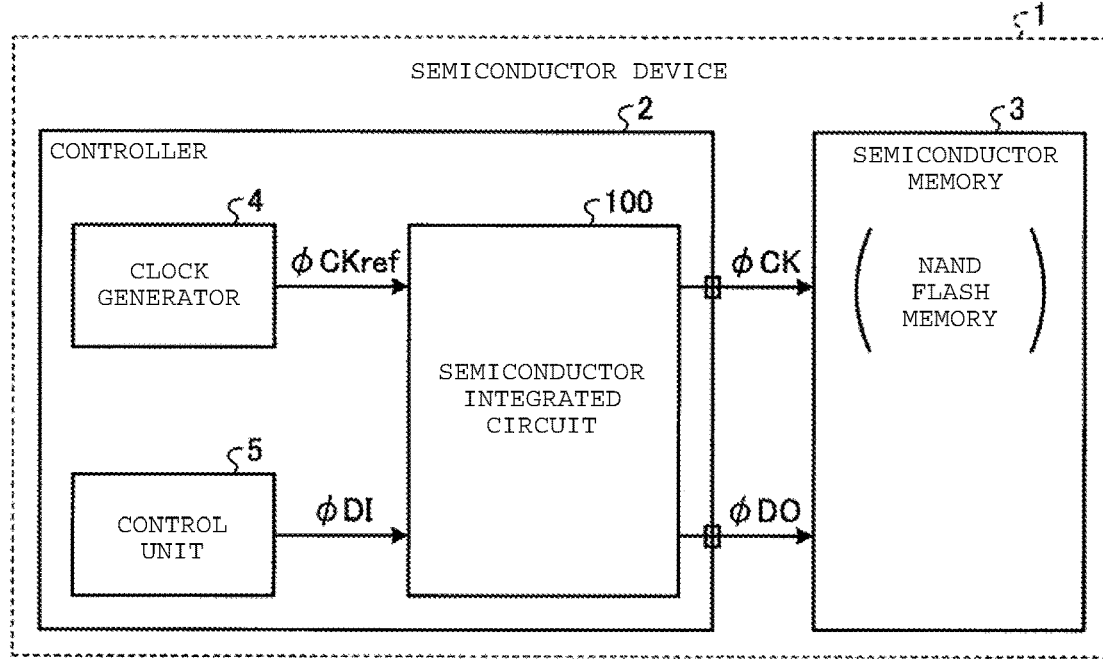
FIG. 1 is a diagram illustrating a configuration of a semiconductor device including a semiconductor integrated circuit according to some embodiments.

A semiconductor integrated circuit according to some embodiments is described. The semiconductor integrated circuit is used as an interface for a semiconductor memory. For example, a semiconductor integrated circuit 100 is mounted on a semiconductor device 1 illustrated in FIG. 1. FIG. 1 is a diagram illustrating a configuration of the semiconductor device 1 including the semiconductor integrated circuit 100.

The semiconductor device 1 includes a controller 2 and a semiconductor memory 3. The controller 2 includes a clock generator 4, a control unit 5, and the semiconductor integrated circuit 100.

For example, in the semiconductor memory 3 such as a NAND flash memory performing an operation in synchronization with a clock, an internal clock which controls a phase is necessary. Therefore, the semiconductor integrated circuit 100 receives a reference clock φCKref from the clock generator 4 and receives data φDI from the control unit 5. The semiconductor integrated circuit 100 adjusts a duty ratio of the received reference clock φCKref to generate an internal clock φCK, supplies the generated internal clock φCK to the semiconductor memory 3, and transfers the received data φDI as data φDO to the semiconductor memory 3 without change. Thus, the semiconductor memory 3 can latch the data φDO with the internal clock φCK.

Figure 2:
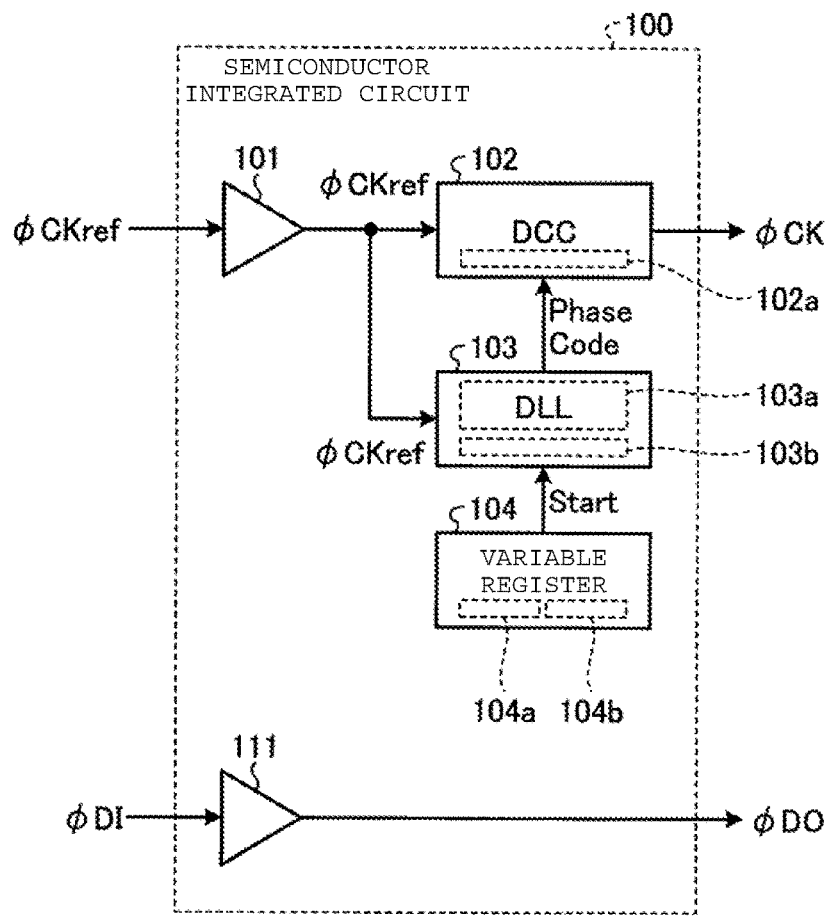
FIG. 2 is a diagram illustrating a configuration of the semiconductor integrated circuit according to some embodiments.

Here, with acceleration of an access speed requested in the semiconductor device 1, the semiconductor integrated circuit 100 includes receivers 101 and 111, a delay locked loop (DLL) circuit 103, and a duty cycle corrector (DCC) circuit 102, as illustrated in FIG. 2. As the DLL circuit 103, it maybe a DLL circuit capable of performing locking at a high speed (for example, within a few of clocks since transfer start) using time to digital convert (TDC) technology.

In the semiconductor integrated circuit 100, the receiver 101 receives the reference clock φCKref and the receiver 111 receives the data φDI. The receiver 101 transfers the reference clock φCKref to the DLL circuit 103 and transfers the reference clock φCKref to the DCC circuit 102.

The DLL circuit 103 detects a reference delay amount (for example, a delay amount equivalent to one cycle of the reference clock φCKref) based on the reference clock φCKref. For example, the DLL circuit 103 may include a delay chain 103a in which a plurality of delay elements having a mutually equivalent delay amount is connected in series and a phase comparison circuit 103b, and can detect a reference delay amount by comparing a phase of an output of each delay stage in the delay chain 103a to a phase of the reference clock φCKref. The DLL circuit 103 calculates the number of delay stages (for example, the number of delay stages equivalent to a predetermined phase amount) corresponding to the reference delay amount in accordance with a detection result (phase comparison result). The DLL circuit 103 supplies a calculation result as a phase code to the DCC circuit 102.

The DCC circuit 102 calculates an adjustment amount of a duty ratio for the reference clock φCKref in accordance with the phase code. The DCC circuit 102 includes a delay chain 102a corresponding to the delay chain 103a. The DCC circuit 102 performs phase control (duty correction+phase shift) to delay a rising edge and/or a falling edge of the reference clock φCKref while using the delay chain 102a in accordance with the calculated adjustment amount. Thus, the DCC circuit 102 generates the internal clock φCK. The receiver 111 transfers the data φDI as the data φDO without change.

For example, a transfer start time of the reference clock φCKref from the clock generator 4 to the semiconductor integrated circuit 100 may be a period in which power at the time of activation of the semiconductor device 1 is not stable in some cases. Thus, in the semiconductor integrated circuit 100, the head reference clock φCKref received at the time of the transfer start is not stable and the internal clock φCK generated based on the head reference clock φCKref is not stable in some cases.

With acceleration of a requested access speed, a semiconductor memory, performing an operation in regard to a command in synchronization with a double edge of a clock, is used as the semiconductor memory 3 which is a target on which the semiconductor integrated circuit 100 performs an interface operation. For example, the semiconductor memory 3 conforms to a standard such as double-data-rate (DDR), DDR2, DDR3, low power double-data-rate (LPDDR), LPDDR2, open NAND flash interface (ONFI). The semiconductor memory 3 may be a nonvolatile memory such as a NAND flash memory or a volatile memory such as a synchronous dynamic random access memory (SDRAM).

At this time, unless the internal clock φCK to be used to latch data φDO is stable, a setup time and a hold time in the latching of the data φDO are not sufficiently ensured, and thus there is a possibility of a value of the erroneous data φDO being latched with the nonvolatile memory 3.

Accordingly, in the semiconductor integrated circuit 100 according to the embodiment, optimization of the internal clock φCK to be generated is achieved by varying a timing at which detection of the reference delay amount based on the reference clock φCKref starts (for example, a timing is delayed until the reference clock φCKref becomes stable).

Specifically, in the semiconductor integrated circuit 100, a warm-up cycle period Twu, in which the data φDO is not latched at the time of reception start of the reference clock φCKref for standby, is provided and a variable register 104 that can arbitrarily select a lock timing (a detection start timing of the standard delay amount by the DLL circuit 103) during the warm-up cycle period Twu is added. The variable register 104 stores a start code (Start) indicating a lock timing (a detection start timing of the standard delay amount by the DLL circuit 103). The variable register 104 can include a warm-up cycle setting register 104a and a DLL lock timing register 104b. The start code (Start) can include a setting value of the warm-up cycle period Twu and a setting value of a timing at which the length of one cycle of the reference clock φCKref during the warm-up cycle period Twu is stable. The variable register 104 supplies the start code to the DLL circuit 103 at a predetermined timing such as an operation start time of the semiconductor integrated circuit 100. The timing indicated by the start code (Start) can be determined in advance experimentally as a timing at which the length of one cycle of the reference clock φCKref during the warm-up cycle period Twu is stable.

Accordingly, the DLL circuit 103 does not immediately start an operation of detecting the reference delay amount even when reception of the reference clock φCKref starts and the warm-up cycle period Twu starts, and waits until a timing indicated by the start code (for example, a timing at which a predetermined number of clocks elapse from the start of the warm-up cycle period Twu). The DLL circuit 103 starts the operation of detecting the reference delay amount based on the timing indicated by the start code during the warm-up cycle period Twu. Thus, since the DLL circuit 103 can perform the operation of detecting the standard delay amount at the timing at which the length of one cycle of the reference clock φCKref is stable, an appropriate number of delay stages corresponding to the reference delay amount can be supplied to the DCC circuit 102, so that the DCC circuit 102 can generate the appropriate internal clock φCK.

Figure 3:
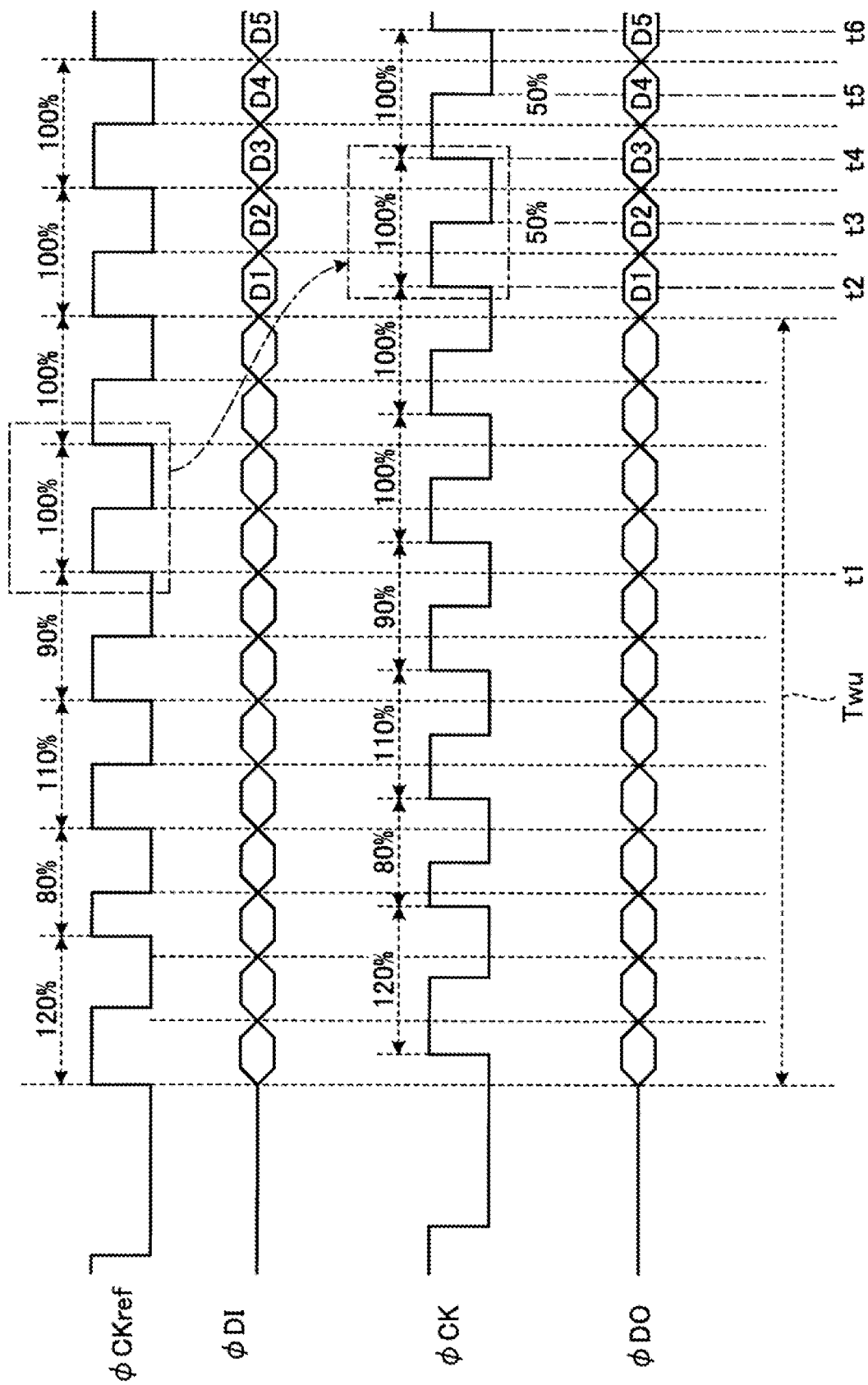
FIG. 3 is a waveform diagram illustrating an operation of the semiconductor integrated circuit according to some embodiments.

For example, the semiconductor integrated circuit 100 can operate as illustrated in FIG. 3. FIG. 3 is a waveform diagram illustrating an operation of the semiconductor integrated circuit 100.

In the example illustrated in FIG. 3, the DLL circuit 103 detects the number of delay stages equivalent to one cycle of the reference clock φCKref and supplies the DCC circuit 102 with the phase code indicating the duty ratio of 50% and the phase code indicating a phase shift of 25% in accordance with the number of delay stages of one cycle. The DCC circuit 102 calculates the number of delay stages equivalent to the duty ratio of 25% based on the phase code, delays the rising edge and the falling edge of the reference clock φCKref equivalent to the number of delay stages using the delay chain 102a, and generates the internal clock φCK.

As illustrated in FIG. 3, a period of six clocks of the reference clock φCKref is provided as the warm-up cycle period Twu. For example, when locking is performed with two head cycles at which power is unstable during the warm-up cycle period Twu, one cycle of the reference clock φCKref is locked with the head clock deviating by 120% of an appropriate original length. For example, a phase code in which the duty ratio of 50% is to be set maybe generated as a phase code with the duty ratio of 60%. That is, when the number of delay stages corresponding to one cycle appropriate for the reference clock φCKref is 10 stages and the locking is performed with the head clock deviating by 120%, the number of delay stages of one cycle of the reference clock φCKref may be calculated as 12 stages and the phase code indicating 6 stages is supplied as the phase code with the duty ratio of 50% to the DCC circuit 102. Thus, the semiconductor memory 3 receiving the internal clock φCK generated by the DCC circuit 102 may perform the locking at an erroneous phase angle (that is, normal transfer may not be performed).

However, as illustrated in FIG. 3, for example, when 4 cycles of the reference clock φCKref are necessary as cycles necessary to stabilize power and 2 cycles of the reference clock φCKref are necessary as cycles necessary for the DLL lock, locking can be performed at timing t1 at which power is stable (a cycle is stable) by setting "6" in the warm-up cycle setting register 104a and setting "5" in the DLL lock timing register 104b. That is, since the DLL circuit 103 can detect one cycle appropriate for the reference clock φCKref, 10 stages can be calculated as the number of delay stages corresponding to the one cycle and the phase code indicating 5 stages can be supplied as the phase code with the duty ratio of 50% to the DCC circuit 102. Accordingly, the DCC circuit 102 can generate the internal clock φCK that has rising edges or falling edges at timings t2, t3, t4, t5, t6, and the like at which a value of the data φDO is stable (timings at which a setup time and a hold time are sufficiently ensured).

Since "the minimum number of cycles necessary for power stability (warm-up)"+"the minimum number of cycles necessary for DLL lock" can be set, access can be made for a minimum necessary latency, and thus it is possible to prevent deterioration in performance of the semiconductor integrated circuit 100.

As described above, in the embodiment, a timing at which detection of the reference delay amount based on the reference clock φCKref is started is variable in the semiconductor integrated circuit 100. For example, a lock timing of the DLL circuit 103 may be delayed until the reference clock φCKref becomes stable. Thus, it is possible to optimize the internal clock φCK generated by the DCC circuit 102. That is, in the semiconductor device 1 on which the DLL circuit 103 capable of performing high-speed locking is mounted, precision of the locking by the DLL circuit 103 can be improved even when the reference clock φCKref is unstable. Accordingly, it is possible to generate the appropriate internal clock φCK.

FIG. 1 exemplifies the case in which the reference clock φCKref and the data φDI are generated inside the semiconductor device 1. However, the reference clock φCKref and the data φDI may be received from the outside of the semiconductor device 1. Even in this case, the semiconductor integrated circuit 100 having the same configuration as in the embodiment can achieve the same effects.

Figure 4:
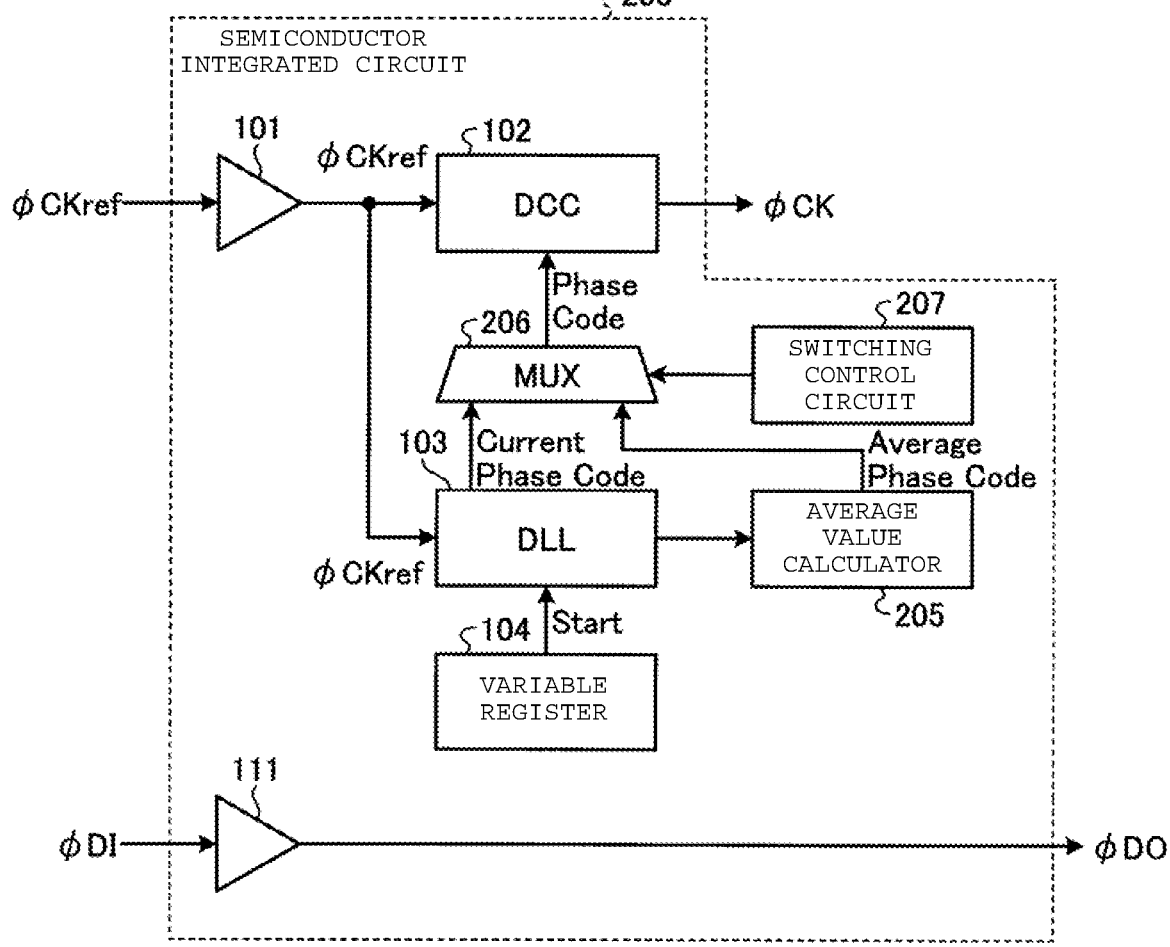
FIG. 4 is a diagram illustrating a configuration of a semiconductor integrated circuit according to a modification example of some embodiments.

Alternatively, a semiconductor integrated circuit 200 may be devised for an improvement in performance. For example, the value of the number of delay stages calculated based on the reference clock φCKref can be changed when the reference clock φCKref is varied. However, by performing time averaging, it is possible to reduce an influence of the variation in the value of the number of delay stages to some extent. On the basis of such an idea, the semiconductor integrated circuit 200 can be configured as illustrated in FIG. 4. FIG. 4 is a diagram illustrating a configuration of the semiconductor integrated circuit 200.

That is, the semiconductor integrated circuit 200 further includes an average value calculator 205, a multiplexer (MUX) 206, and a switching control circuit 207 in addition to the configuration illustrated in FIG. 2. The average value calculator 205 receives phase codes, for example, when the DLL circuit 103 supplies phase codes (current phase codes) to the side of the DCC circuit 102, and performs time averaging of the phase codes. For example, when the phase codes are received N times (N is an integer equal to or more than 2), the average value calculator 205 divides a sum of the number of delay stages indicated by the phase codes of the immediately previous N times by N to obtain an average number of delay stages. The average value calculator 205 generates the average phase code indicating the average number of delay stages and supplies the average phase code to the multiplexer 206.

The average value calculator 205 can maintain an immediately previously calculated average phase code, for example, when the operation of the semiconductor integrated circuit 200 is stopped. The switching control circuit 207 switches the multiplexer 206 to a state in which the average phase code calculated by the average value calculator 205 is supplied to the DCC circuit 102 (a first state) until the operation of the semiconductor integrated circuit 200 is stopped and subsequently activated again. Then, the switching control circuit 207 switches the multiplexer 206 to a state in which the phase code calculated by the DLL circuit 103 is supplied to the DCC circuit 102 (a second state) at a timing at which power is stable.

Figure 5:
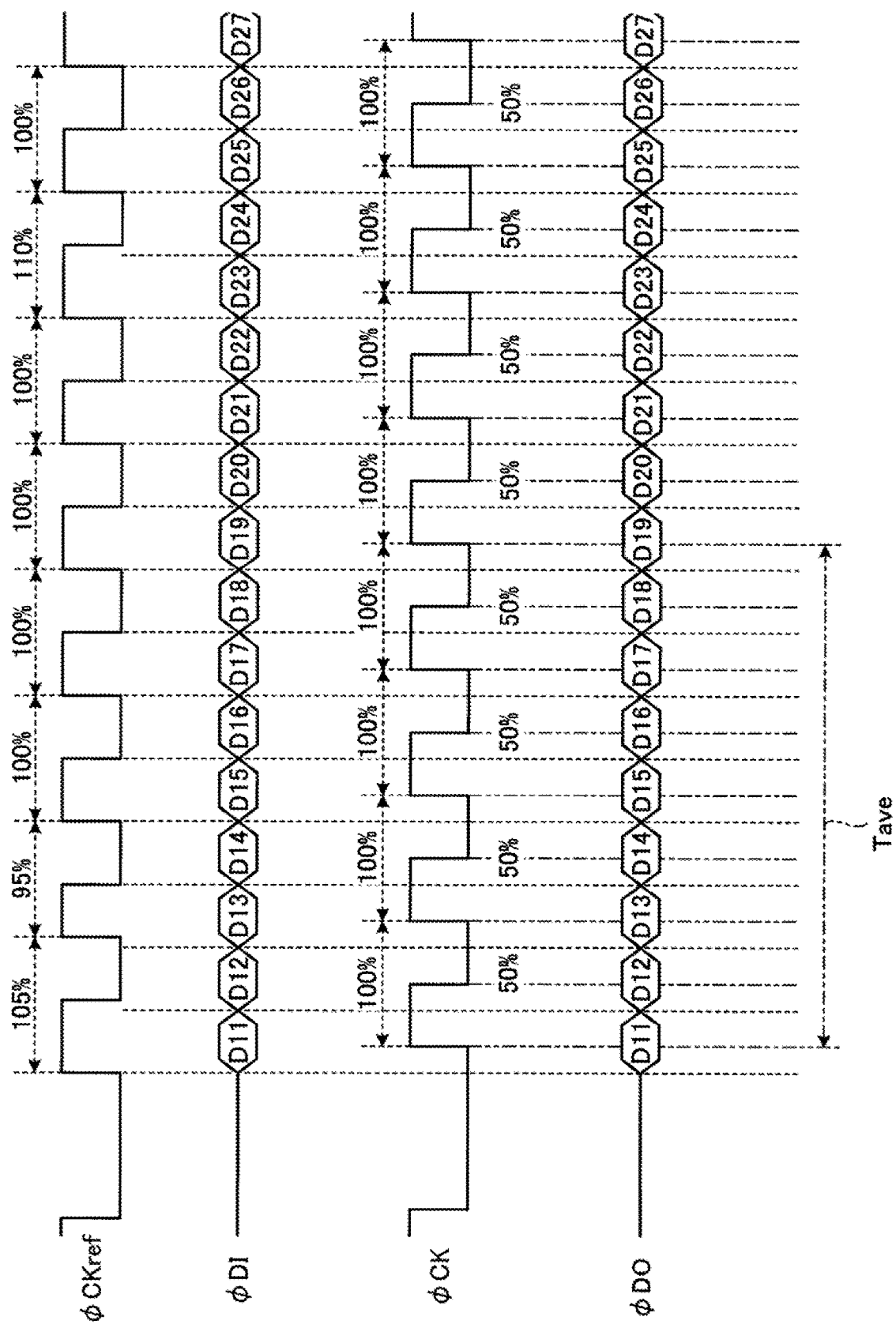
FIG. 5 is a waveform diagram illustrating an operation of the semiconductor integrated circuit according to the modification example of some embodiments.

For example, when "3" is set in the DLL lock timing register of the variable register 104, an operation illustrated in FIG. 5 can be performed. In FIG. 5, during a period Tave in which the head power is unstable, switching to a locked phase code (current phase code) is performed at a time point in which the power is stable (the fourth cycle in FIG. 5), using the average phase code at the time of the previous transfer.

Thus, the semiconductor integrated circuit 200 can generate the internal clock φCK, in which the data φDO can be latched, even during a period equivalent to the warm-up cycle period Twu at a time of activation subsequent to the second activation. Thus the performance can be improved.

Figure 6:
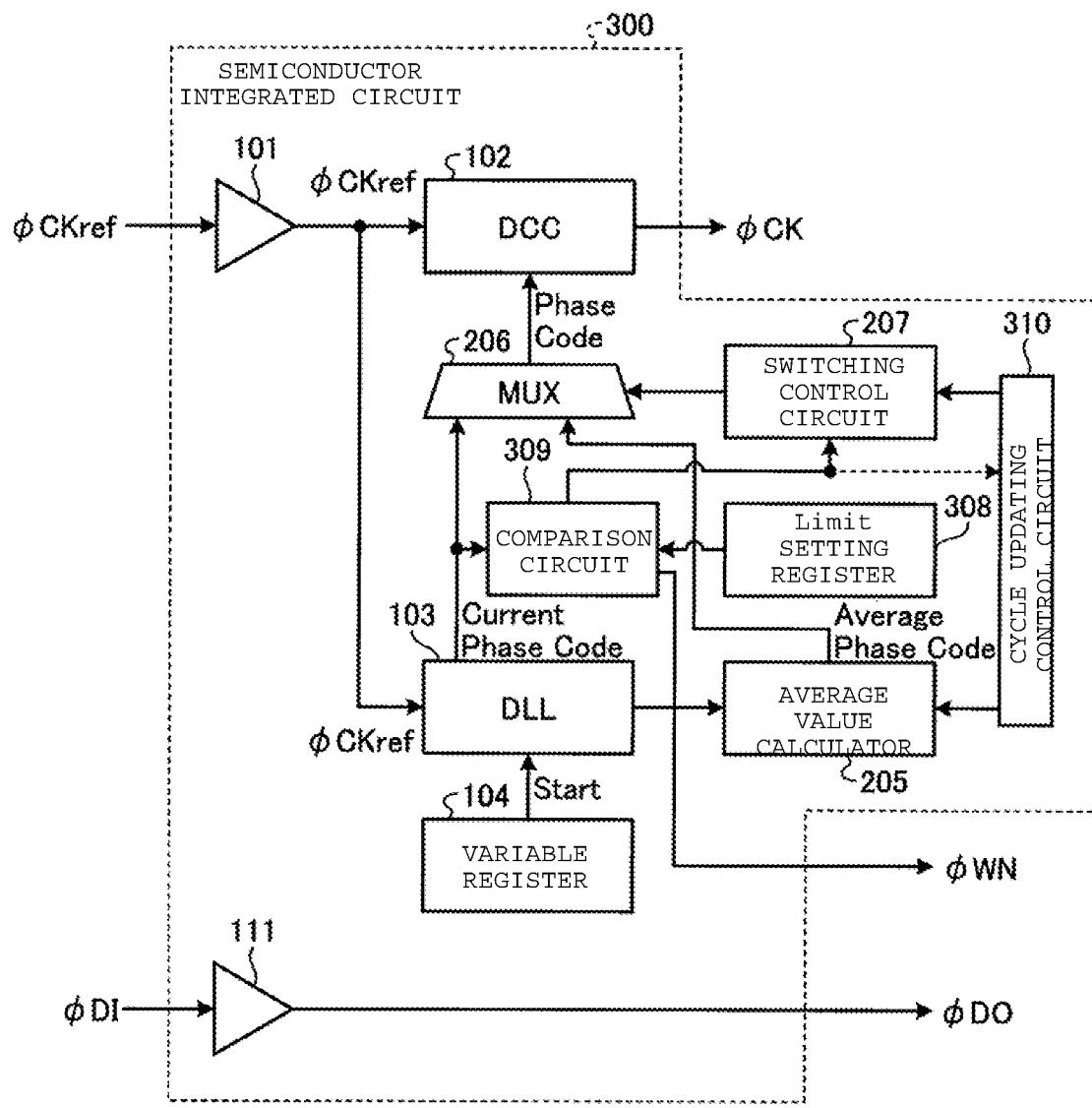
FIG. 6 is a diagram illustrating a configuration of a semiconductor integrated circuit according to another modification example of some embodiments.

Alternatively, a semiconductor integrated circuit 300 maybe devised to further improve the performance. For example, when the number of delay stages subjected to time averaging at the time of variation detection is used, it is possible to further reduce an influence of the variation in the reference clock φCKref. On the basis of such a concept, the semiconductor integrated circuit 300 can be configured as illustrated in FIG. 6, for example. FIG. 6 is a diagram illustrating a configuration of the semiconductor integrated circuit 300.

That is, the semiconductor integrated circuit 300 further includes a limit setting register 308 and a comparison circuit 309 in addition to the configuration illustrated in FIG. 4. For example, an allowable range (for example, an upper limit and a lower limit) in which the number of delay stages can be varied is set, and thus the limit setting register 308 supplies a limit value at a predetermined timing such as a time of activating the semiconductor integrated circuit 300 to the comparison circuit 309. The comparison circuit 309 receives the phase code (the current phase code) supplied from the DLL circuit 103 to the side of the DCC circuit 102 and compares the number of delay stages indicated by the phase code to the allowable range. When the number of delay stages deviates from the allowable range, the comparison circuit 309 notifies the switching control circuit 207 that the number of delay stages deviates from the allowable range. At this time, the comparison circuit 309 may further notify the outside (for example, the control unit 5 illustrated in FIG. 1) with a warning φWN indicating that the number of delay stages deviates from the allowable range.

Until the switching control circuit 207 is notified that the number of delay stages deviates from the allowable range, the switching control circuit 207 controls the multiplexer 206 in the state in which the phase code calculated by the DLL circuit 103 is supplied to the DCC circuit 102 (the second state). When the switching control circuit 207 is notified that the number of delay stages deviates from the allowable range, the switching control circuit 207 controls the multiplexer 206 such that the state is switched to the state in which the average phase code calculated by the average value calculator 205 is supplied to the DCC circuit 102 (the first state).

Thus, when the cycle of the reference clock φCKref is dynamically varied during the operation, the semiconductor integrated circuit 300 can reduce the influence of the variation in the cycle and generate the appropriate internal clock φCK. When the variation in the cycle of the reference clock φCKref exceeds an allowable range, the semiconductor integrated circuit 300 can apply a fail-safe operation (operation stop or the like) of the semiconductor integrated circuit 300 by the control unit 5 by notifying, for example, the control unit 5 of the warning φWN.

The semiconductor integrated circuit 300 may be further devised to reduce power consumption. For example, when the phase code is periodically updated, the frequency of an operation for updating can be further reduced than when the phase code is updated every clock cycle. Thus a low power consumption can be attained. That is, the semiconductor integrated circuit 300 may further include a cycle updating control circuit 310. The cycle updating control circuit 310 can perform control such that the average value calculator 205 and the switching control circuit 207 can be periodically operated and can perform control such that the average value calculator 205 and the switching control circuit 207 can be paused at an interval of the cycle. Thus, it is possible to reduce the frequency of the operation of the average value calculator 205 and the switching control circuit 207, and it is possible to reduce the power consumption of the semiconductor integrated circuit 300.

Further, the cycle updating control circuit 310 maybe configured to be notified by the comparison circuit 309 that the number of delay stages deviates from the allowable range, as indicated by a dotted line in FIG. 6. In this case, when the cycle updating control circuit 310 is not notified that the number of delay stages deviates from the allowable range within a predetermined period, the cycle updating control circuit 310 can extend the updating cycle of the phase code. When the cycle updating control circuit 310 is notified that the number of delay stages deviates from the allowable range within the predetermined period, the cycle updating control circuit 310 can shorten the updating cycle of the phase code. For example, when the updating cycle of the phase code is 4 clock cycles during a period Trf1, the updating cycle of the phase code can be extended to 6 clock cycles during a period Trf2 continuing from the period Trf1 in response to the fact that the cycle updating control circuit 310 is not notified that the number of delay stages deviates from the allowable range within the period Trf1. Thus, it is possible to reduce the power consumption of the semiconductor integrated circuit 300.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
   a receiver configured to receive a first clock;
   a detection circuit configured to wait during a first period, during a designated warm up period following the first period to detect a reference delay amount based on the first clock and to obtain a number of delay stages corresponding to the reference delay amount during a second period that continues from the first period; and
   a generation circuit configured to adjust a duty ratio of the first clock based on the obtained number of delay stages and generate a second clock during the second period.

2. The semiconductor integrated circuit according to claim 1, further comprising:
   an arithmetic circuit configured to obtain an average number of delay stages by performing time averaging of the obtained number of delay stages; and
   a switching circuit configured to switch between a first state in which the average number of delay stages is supplied to the generation circuit and a second state in which the number of delay stages is supplied to the generation circuit.

3. The semiconductor integrated circuit according to claim 2,
   wherein the switching circuit is further configured to switch to the first state during a third period in which the first clock restarts being input to the receiver, and to switch to the second state during a fourth period that continues from the third period.

4. The semiconductor integrated circuit according to claim 3,
   wherein the switching circuit is further configured to switch to the first state during the fourth period in response to determining, based on the average number of delay stages, that the number of delay stages deviates from an allowable range.

5. The semiconductor integrated circuit according to claim 4, further comprising:
   a limit setting register configured to store an upper and lower limit of the allowable range; and
   a comparison circuit configured to compare the number of delay stages with the allowable range, and to notify the switching control circuit in response to determining that the number of delay stages is outside the allowable range.

6. The semiconductor integrated circuit according to claim 4, further comprising:
   a limit setting register configured to store an upper and lower limit of the allowable range;
   a cycle updating control circuit; and
   a comparison circuit configured to compare the number of delay stages with the allowable range, and to notify the cycle updating control circuit in response to determining that the number of delay stages is outside the allowable range, wherein
   when the cycle updating control circuit is notified by the comparison circuit, the cycle updating control circuit is configured to shorten an updating cycle.

7. The semiconductor integrated circuit according to claim 4,
   wherein, when the number of delay stages deviates from the allowable range, a warning signal is generated.

8. The semiconductor integrated circuit according to claim 3, further comprising:
   a control circuit configured to control the switching circuit such that the switching circuit switches between the first and second states at a period corresponding to a plurality of periods of the first clock during the fourth period.

9. A method of generating a clock comprising:
   receiving a first clock;
   waiting for a first period;
   during a designated warm up period following the first period, detecting a reference delay amount based on the first clock;
   obtaining a number of delay stages corresponding to the reference delay amount during a second period that continues from the first period;
   adjusting a duty ratio of the first clock based on the obtained number of delay stages; and
   generating a second clock during the second period.

10. The method according to claim 9, further comprising:
    obtaining an average number of delay stages by performing time averaging of the number of delay stages; and
    switching between a first state in which the average number of delay stages obtained is supplied to a generation circuit that is configured to generate the second clock and a second state in which the number of delay stages is supplied to the generation circuit.

11. The method according to claim 10, further comprising:

switching to the first state during a third period in which the first clock restarts being input; and switching to the second state during a fourth period continuing from the third period.

12. The method according to claim 11, further comprising:

switching to the first state during the fourth period when the number of delay stages deviates from an allowable range based on the average number of delay stages.

* * * * *